United States Patent
Takahashi

(10) Patent No.: US 6,785,853 B2
(45) Date of Patent: *Aug. 31, 2004

(54) INTEGRATION TYPE INPUT CIRCUIT AND METHOD OF TESTING IT

(75) Inventor: Yasuhiko Takahashi, Chiyoda-Ku (JP)

(73) Assignee: United Microelectronics Corporation, Hsin Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/159,106

(22) Filed: Jun. 3, 2002

(65) Prior Publication Data

US 2002/0144199 A1 Oct. 3, 2002

Related U.S. Application Data

(63) Continuation of application No. 09/481,675, filed on Jan. 12, 2000, which is a continuation of application No. 08/996,184, filed on Dec. 22, 1997, now Pat. No. 6,070,257, which is a continuation of application No. 08/948,941, filed on Oct. 10, 1997, now Pat. No. 6,037,824.

(30) Foreign Application Priority Data

Dec. 26, 1996 (JP) .......................................... 08-347564

(51) Int. Cl.$^7$ ............................................. G01R 31/28
(52) U.S. Cl. ...................................... 714/724; 327/336
(58) Field of Search .................................. 714/724, 726, 714/735, 742, 744–745; 327/64, 63, 65, 68, 77–78, 326

(56) References Cited

U.S. PATENT DOCUMENTS

| | | | | |
|---|---|---|---|---|
| 3,845,401 A | * | 10/1974 | Troiani et al. .................. 330/2 |
| 4,954,784 A | * | 9/1990 | Kitamura ..................... 327/237 |
| 5,030,954 A | * | 7/1991 | Ribner ........................ 341/143 |
| 5,262,686 A | | 11/1993 | Kurosawa .................... 307/362 |
| 5,381,053 A | | 1/1995 | Yasuda .......................... 327/65 |
| 5,459,734 A | * | 10/1995 | Yokoyama .................. 714/724 |
| 5,801,554 A | | 9/1998 | Momma et al. .............. 327/89 |
| 5,898,332 A | * | 4/1999 | Lefevre ....................... 327/336 |
| 6,470,466 B1 | * | 10/2002 | Takahashi .................... 714/724 |

FOREIGN PATENT DOCUMENTS

JP      A-8-63268      3/1996

* cited by examiner

Primary Examiner—Guy J. Lamarre
(74) Attorney, Agent, or Firm—Connolly Bove Lodge & Hutz LLP; Larry J. Hume

(57) ABSTRACT

An input interface circuit is provided. The circuit includes an input transistor for receiving a digital input signal, a circuit for generating a reference value, and an integrating capacitor connected in series to a pair of current conducting electrodes of the input transistor for integrating the input signal. A logic level of the input signal is discriminated by comparing an integration of the input signal with the reference value. To provide a testing function, a test transistor is connected to a junction between the pair of current conducting electrodes of the input transistor and the integrating capacitor so that a current driving capability may be determined. Additionally, a discharge path circuit for controllably discharging the integrating capacitor is connected to the junction between the input transistor and the integrating capacitor.

21 Claims, 4 Drawing Sheets

INTEGRATION TYPE INPUT CIRCUIT AND METHOD OF TESTING IT

This application is a Continuation of pending U.S. Application Ser. No. 09/481,675 by Yasuhiko Takahashi filed Jan. 12, 2000 for "INTEGRATION TYPE INPUT CIRCUIT AND METHOD OF TESTING IT", which is a continuation of U.S. patent application Ser. No. 08/996,184 by Yasuhiko Takahashi, filed Dec. 22, 1997 now U.S. Pat. No. 6,070,257, which is a continuation of U.S. patent application Ser. No. 08/948,941 by Yasuhiko Takahashi, filed Oct. 10, 1997 now U.S. Pat. No. 6,037,824, the entire contents of each of which are hereby incorporated by reference, and for which domestic priority is claimed under 35 U.S.C. §120, and for which priority under 35 U.S.C. §119 is claimed to co-pending Japanese application 08-347564, filed on Dec. 26, 1996.

BACKGROUND OF THE INVENTION

The present invention relates to a digital signal input circuit and a method of testing it, and more particularly to an input interface circuit to which a high-speed and small-amplitude digital signal is applied.

For example, a personal computer includes functional IC blocks such as a CPU, a memory controller and a memory. The memory controller controls an access from the CPU or the other device to the memory. The transfer of data between the CPU and the memory controller and the transfer of data between the memory controller and the memory are performed through buses, respectively.

Data received by each of these or similar IC blocks from the other IC block is in the form of a high-speed and small-amplitude digital signal. Since the amplitude of the signal is too small, the data cannot be handled by a circuit in the IC block as it is. Especially, if an inputted digital signal includes noise superimposed thereon, the determination of a logic level thereof will be difficult. Accordingly, it is common that an input portion of the IC block such as a memory controller or a memory is provided with an input interface circuit which performs discrimination and waveform shaping of an inputted digital signal.

Many conventional input interface circuits includes a combination of a current mirror type differential amplifier and a latch circuit. In this interface circuit, a logical level of an input signal having a small peak-to-peak voltage of, for example, about 0.8 V is discriminated through the comparison thereof with a reference signal by use of the current mirror type differential amplifier, the discriminated input signal is amplified up to a voltage of, for example, about 2.5 V to 3.0 V which can be handled by a digital circuit, and the amplified output signal is held by the latch circuit which is a digital circuit. The test of the operation of such a differential input type input interface circuit includes a test through which the judgement is made of whether or not a set-up operation from a point of time of stabilization of an output of the differential amplifier to a point of time when it can be held by the latch circuit falls within a specified set-up time.

The judgement is made on the basis of two criteria. One is concerned with the timing of the set-up operation, that is, whether or not a transistor in the input interface circuit has a sufficient driving capability for discrimination of a logical level in a prescribed time. The other is concerned with whether or not the sampling for the latch circuit of the input interface circuit is performed in the prescribed time.

For such a test of the operation of the input interface circuit, there has hitherto been used a memory tester which generates an analog signal having a linearly varying rise pattern and applies this analog signal to the input interface circuit in a manner such that the applied analog signal is sequentially shifted by a short time to measure a time until a normal operation is no longer available.

However, the conventional tester provided with the above-mentioned function of generating an analog signal capable of short-time shifts has a complicated circuit structure and is therefore high in cost. Accordingly, an input interface circuit completed through a test using such a costly tester becomes expensive.

Further, JP-A-8-63268 (laid open on Mar. 8, 1996) has disclosed an input/output interface circuit provided with an integrating circuit. However, no reference is made to the test of that circuit.

SUMMARY OF THE INVENTION

One object of the present invention is to provide an input interface circuit having a function for facilitating a test.

The input interface circuit according to the present invention may be used with the above-mentioned digital IC block.

Another object of the present invention is to provide a method of testing an input interface circuit.

According to one aspect of the present invention, an input interface circuit is provided with an input transistor for receiving a digital input signal, a circuit for generating a reference value, and an integrating capacitor connected in series to a pair of current conducting electrodes of the input transistor for integrating the input signal, a logical level of the input signal being discriminated by comparing an integration of the input signal with the reference value. For a testing function mode, a test transistor is connected to a junction between the pair of current conducting electrodes of the input transistor and the integrating capacitor so that a current driving capability is determined. Also, a discharge path circuit for controllably discharging the integrating capacitor is connected to the junction between the input transistor and the integrating capacitor.

According to another aspect of the present invention, a method of testing an input interface circuit provided with an input transistor for receiving a digital input signal, a circuit for generating a reference value, an integrating capacitor connected in series to a pair of current conducting electrodes of the input transistor for integrating the input signal, a test transistor connected to a junction between the pair of current conducting electrodes of the input transistor and the integrating capacitor, and a discharge path circuit for controllably discharging the integrating capacitor is connected to the junction between the input transistor and the integrating capacitor, includes the steps of:

operating one of the input and test transistors so that fixed current flows through a pair of current conducting electrodes of the one transistor;

operating the other transistor by applying a sequentially varying signal to the other transistor so that current flowing through a pair of current conducting electrodes of the other transistor is sequentially varied;

comparing an output of the integrating capacitor with the reference value to determine a logical level of the input signal, and;

finding a value of the sequentially varying signal when the determined logical level is changed from one state to another.

DESCRIPTION OF THE PREFERRED EMBODIMENTS

Figure 1:
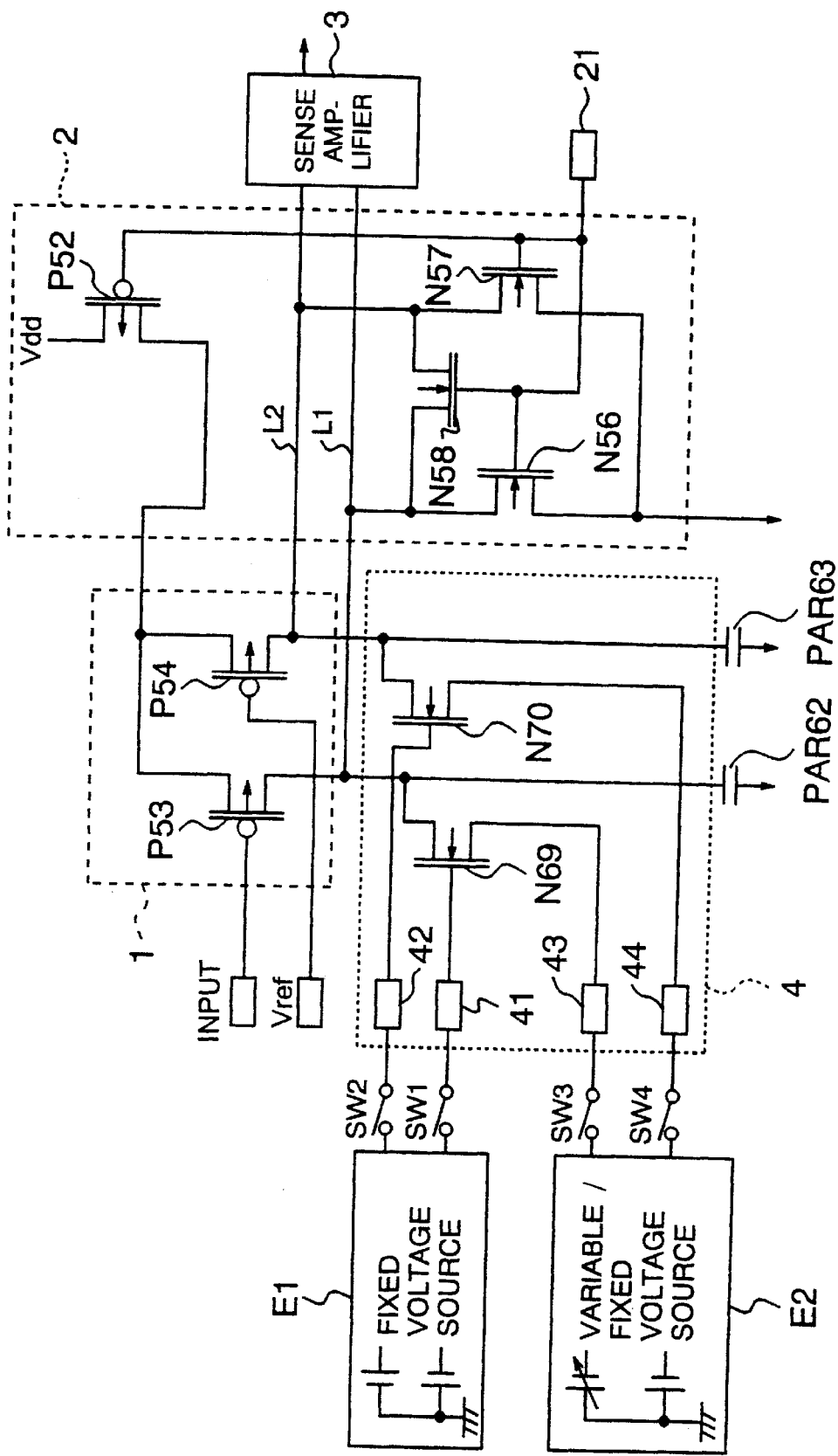
FIG. 1 is a block diagram of an input interface circuit according to an embodiment of the present invention.

In FIG. 1 showing a block diagram of an input interface circuit according to an embodiment of the present invention, an input circuit section 1 includes first and second transistors P53 and P54 which are, for example, P-type MOS transistors. Each of the transistors P53 and P54 has a pair of current conducting electrodes (or source/drain electrodes) and a control electrode (or gate electrode). The transistor P53 receives a digital input signal and the transistor P54 receives a reference signal. The source of the transistors P53 and P54 are connected to a precharge transistor P52 (for example of, P type) in a precharge circuit section 2. The drains of the transistors P53 and P54 are respectively connected through an input signal line L1 and a reference signal line L2 to input terminals of a differential amplifier included in a sense amplifier 3. The signal lines L1 and L2 are connected to respective terminals of transistors N56 and N57 (for example, N-type MOS transistors) in the precharge circuit section 2 and are discharged in accordance with a control signal supplied to the gates of the transistors N56 and N57 from a control terminal 21. An N-type transistor N58 serves to hold the signal lines L1 and L2 at the same potential in a state in which the signal lines L1 and L2 are precharged (or reset), that is, a state in which capacitors PAR62 and PAR63 mentioned later on are discharged. The transistors N56, N57 and N58 form a discharge path circuit for the capacitors PAR62 and PAR63. Accordingly, this discharge path circuit is connected to a junction between the transistor P53 and the integrating capacitor PAR62 and to a junction between the transistor P54 and the integrating capacitor PAR63.

The signal lines L1 and L2 are also connected to a test circuit section 4. The test circuit section 4 includes MOS transistors N69 and N70 of a conduction type (in the shown example, N type) opposite to that of the first and second transistors P53 and P54 in the input circuit section 1. The sources of the transistors N69 and N70 are connected to the signal lines L1 and L2, respectively. Each of the transistors N69 and N70 has a pair of current conducting electrodes (or source/drain electrodes) and a control electrode (or gate electrode).

In order to facilitate understanding the invention, it is shown in FIG. 1 that the capacitors PAR62 and PAR63 are connected to the signal lines L1 and L2, respectively. For these capacitors, use may be made of stray capacitances provided by paths extending from the first and second transistors P53 and P54 of the input circuit section 1 to the sense amplifier (or differential amplifier) 3. A test pad 41 is connected to the gate of the N-type MOS transistor N69 and a test pad 42 is connected to the gate of the N-type MOS transistor N70.

In the present embodiment, the integrating capacitor PAR62 is a stray capacitance formed between a common potential source and a junction between the transistor P53 and the transistor N69, and the integrating capacitor PAR63 is a stray capacitance formed between the common potential source and a junction between the transistor P54 and the transistor N70.

In a usual input signal discriminating operation of the circuit shown in FIG. 1, the precharging (or resetting) of the signal lines L1 and L2 by the precharge circuit section 2 is first performed. Namely, the capacitors PAR62 and PAR63 are discharged through the discharge path circuit (N56 to N57) of the precharge circuit section 2. Next, with the signal lines L1 and L2 being precharged by the turn-on of the precharge transistor P52, a supply voltage Vdd is supplied to the sources of the transistors P53 and P54. When the transistors P53 and P54 are turned on in response to an input digital signal and a reference signal supplied to input terminals INPUT and Vref, the capacitors PAR62 and PAR63 are charged in accordance with the amplitudes of the input digital signal and the reference signal. This charging operation corresponds to an integrating operation. Voltages developed by the charged capacitors PAR62 and PAR63 are applied to the sense amplifier 3 which in turn amplifies a difference between both the voltages as the result of comparison thereof. In accordance with an external clock signal, data is latched by a latch circuit included in the sense amplifier 3. As a result, an output of a logical level corresponding to a difference in potential between the reference signal line L2 and the input signal line L1 is taken out of the sense amplifier 3.

The control of the charging/discharging (or integration time) of the capacitors PAR62 and PAR63 and the turn-on/off of the discharge circuit is performed in accordance with a control clock signal supplied to the control terminal 21.

In the usual input signal discriminating operation mentioned above, test pads 41 to 44 in the test circuit section 4 are placed in an open state by switches SW1 to SW4. Accordingly, the transistors N69 and N70 have no influence on the capacitors PAR62 and PAR63.

Next, a description will be given of a testing function mode of the input interface circuit shown in FIG. 1.

(1) Test of First Transistor P53 in Input Circuit Section 1 for Receiving Input Signal Voltages similar to the two input voltages in the usual input signal discriminating operation mode, for example, voltages of 1.4 V±0.4 V and 1.4 V are applied to the input terminals INPUT and Vref, respectively. A signal having a logical level of HIGH is supplied to the test pad 41 by the switch SW1 and a voltage source E1 so that the transistor N69 is turned on. Signals of a logical level of LOW are respectively supplied to the test pad 42 by the switch SW2 and the voltage source E1 and to the test pad 44 by the switch SW4 and a voltage source E2 so that the transistor N70 is brought into a turned-off condition.

A test signal is applied to the test pad 43 by the switch SW3 and the voltage source E2. The voltage applied to the test pad 43 is sequentially varied to find whether an output of the sense amplifier 3 is a logic "1" or a logic "0". Namely, the voltage applied to the test pad 43 is sequentially increased or decreased so that the value of a voltage applied to the test pad 43 at the time of change of the output of the sense amplifier 3 from the logic "1" to the logic "0" or from the logic "0" to the logic "1" is read by, for example, a voltmeter. This voltage value can be regarded as an index which represents a current driving capability of the transistor P53. If the current driving capability represented by this index is not out of a tolerance of a design value, it is proved that the operation of the first transistor P53 in the input circuit section is ensured.

Namely, since the transistors P53 and N69 are transistors having different conduction types, the potential of a junction between both the transistors represents a difference in driving capability between both the transistors. Accordingly, the current driving capability is determined from the value of a particular value of the applied test voltage when the output of the sense amplifier is inverted in the case where one of the two transistors is held in a fixed-current operation state while varying an operating current of the other transistor, the particular value of the applied voltage determining an operating current of the other transistor at the time of inversion of the sense amplifier output.

Accordingly, the current driving capability of the transistor P53 can also be determined by applying a fixed voltage to the test pad 43 while varying the voltage of a signal applied to the transistor P53 (i.e., the input terminal INPUT) so that the value of a voltage applied to the test pad 43 at the time of change of the output of the sense amplifier 3 from the logic "1" to the logic "0" or from the logic "0" to the logic "1" is read by, for example, a voltmeter, as mentioned above.

(2) Test of Second Transistor P54 in Input Circuit Section 1 for Receiving Reference Signal Similarly to the case of the test (1), two input voltages in the usual input signal discriminating operation mode are applied to the input terminals INPUT and Vref, respectively. A signal having a logical level of HIGH is supplied to the test pad 42 by the switch SW2 and the voltage source E1 so that the transistor N70 is turned on. Signals of a logical level of LOW are respectively supplied to the test pad 41 by the switch SW1 and the voltage source E1 and to the test pad 43 by the switch SW3 and the voltage source E2 so that the transistor N69 is brought into a turned-off condition.

A test signal is applied to the test pad 44 by the switch SW4 and the voltage source E2. The voltage applied to the test pad 43 is sequentially varied to find whether an output of the sense amplifier 3 is a logic "1" or a logic "0". Namely, the voltage applied to the test pad 44 is sequentially increased or decreased so that the value of a voltage applied to the test pad 44 at the time of change of the output of the sense amplifier 3 from the logic "1" to the logic "0" or from the logic "0" to the logic "1" is read by, for example, a voltmeter. This voltage value can be regarded as an index which represents a current driving capability of the transistor P54. If the current driving capability represented by this index is not out of a tolerance of a design value, it is proved that the operation of the second transistor P54 in the input circuit section is ensured.

Regarding the test of the transistor P54, the current driving capability of the transistor P54 can also be determined, in a manner similar to that in the test of the transistor P53, by applying a fixed voltage to the test pad 44 while varying the voltage of a signal applied to the transistor P54 (i.e., the input terminal Vref) so that the value of a voltage applied to the test pad 43 at the time of change of the output of the sense amplifier 3 from the logic "1" to the logic "0" or from the logic "0" to the logic "1" is ready by, for example, a voltmeter, as mentioned above.

Figure 2:
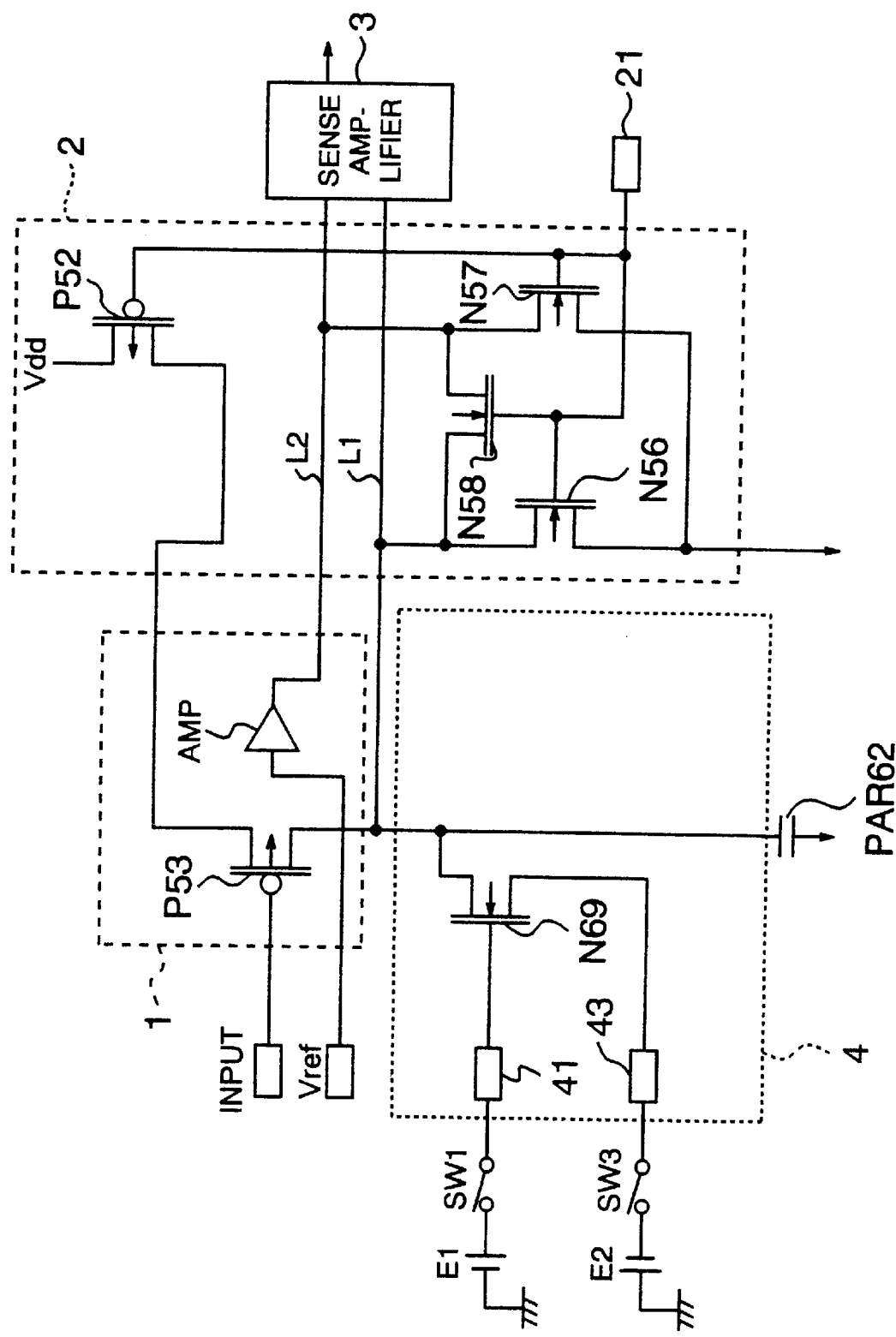
FIG. 2 is a block diagram of an input interface circuit according to another embodiment of the present invention.

FIG. 2 shows a modification of the embodiment shown in FIG. 1.

Namely, in place of the second transistor P54 of the input circuit section 1 and the integrating capacitor PAR63, an amplifier AMP including a low-pass filter is provided between the input terminal Vref and the signal line 12.

It is not necessarily required that a reference signal used for discrimination (or comparison) of a logical level of an input signal should be integrated. As shown in FIG. 2, an output of the amplifier for amplifying the reference signal to a value to be referenced to is applied to one input of the sense amplifier 3, while the input signal is integrated, as in the embodiment shown in FIG. 1, in accordance with a control signal supplied to the control signal 21 so that the integration is applied to another input of the sense amplifier 3 through the signal line L1.

The test of the input circuit section 1 of the input interface circuit shown in FIG. 2 may be performed by conducting the test of only the input transistor P53 in a manner similar to that in the test of the first transistor of the input interface circuit shown in FIG. 1.

Next, a description will be given of the control clock signal supplied to the control terminal 21.

Figure 3:
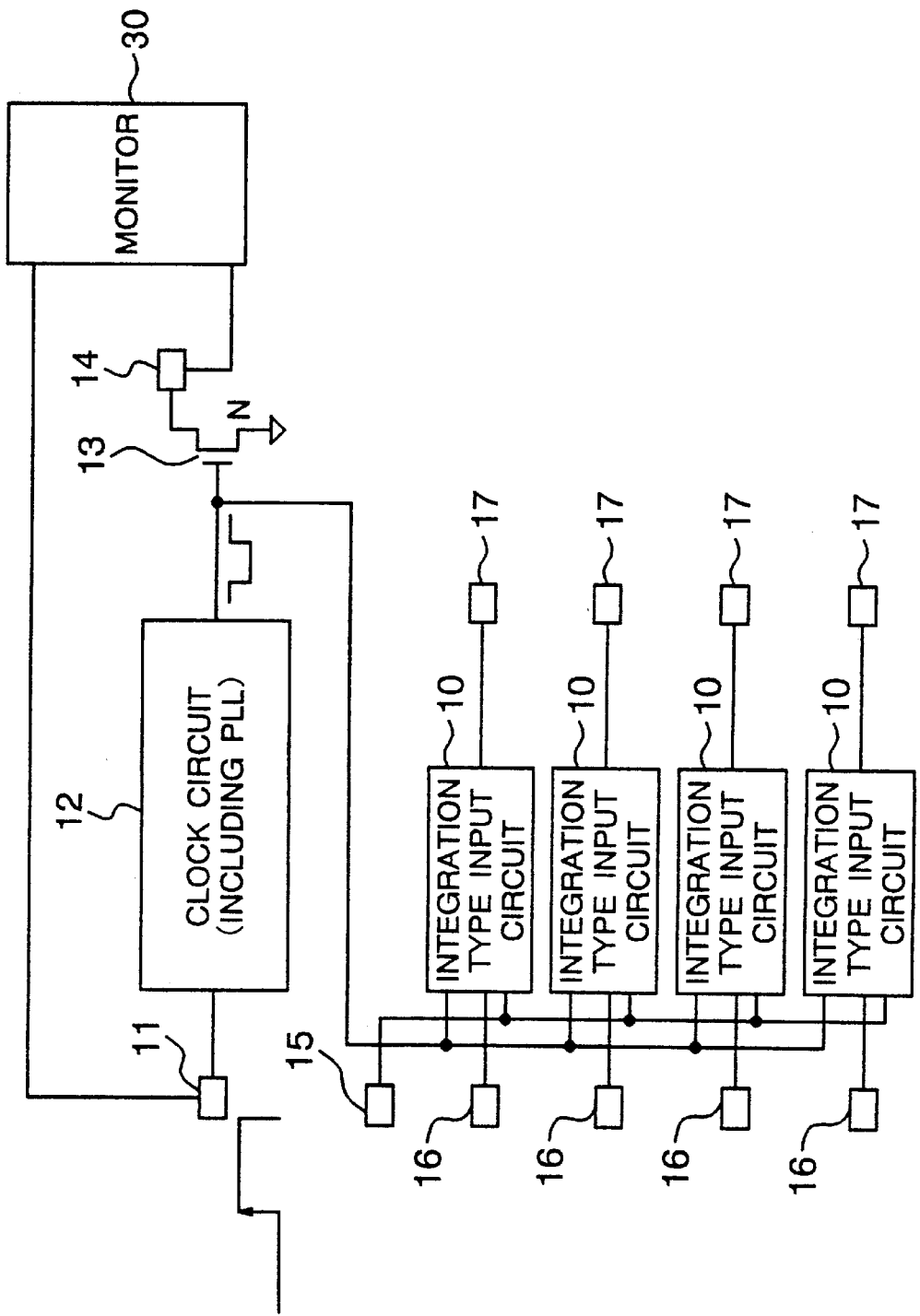
FIG. 3 is a block diagram of an input interface circuit according to a further embodiment of the present invention.

FIG. 3 shows a semiconductor integrated circuit device which includes a plurality of circuits 10 similar to the input interface circuit shown in FIG. 1 or 2 and a control signal generating circuit 12.

The control signal generating circuit has a PLl circuit and receives an external clock signal at a clock terminal 11 to generate a control clock signal which is synchronous in phase with the external clock signal. This control clock signal is outputted to a test pad 14 through a MOS transistor 13, for example, of N type and is also supplied to control terminals of the input interface circuits 10 so that it is used for the control of the charging/discharging of an integrating capacitor and the turn-on/off of a discharge path circuit in each of the circuits 10. A reference signal pad 15 corresponds to the Vref terminal in FIG. 1 and an input signal pad 16 corresponds to the INPUY terminal in FIG. 1. Also, an output test pad 17 is a terminal from which a signal corresponding to the output of the sense amplifier 3 in FIG. 1 is generated.

As mentioned above, a control signal used for the control of the charging/discharging of capacitors PAR62 and PAR63 and the turn-on/off of a discharge circuit in each input interface circuit is generated from the external clock signal. Since a digital input signal to each input interface circuit is inputted with a relation timed with the external clock signal, it is preferable that the control clock signal is as synchronous in phase with the external clock signal as possible. If the phases of the control and external clock signals deviate extremely from each other, the digital input signal discriminating function of the input interface circuit will be deteriorated.

Accordingly, in testing the input interface circuit, the control clock signal is extracted from the test pad 14 and is phase-compared by a monitor 30 with the external clock signal supplied to the clock input terminal 11 to verify a phasic relation therebetween.

Figure 4:
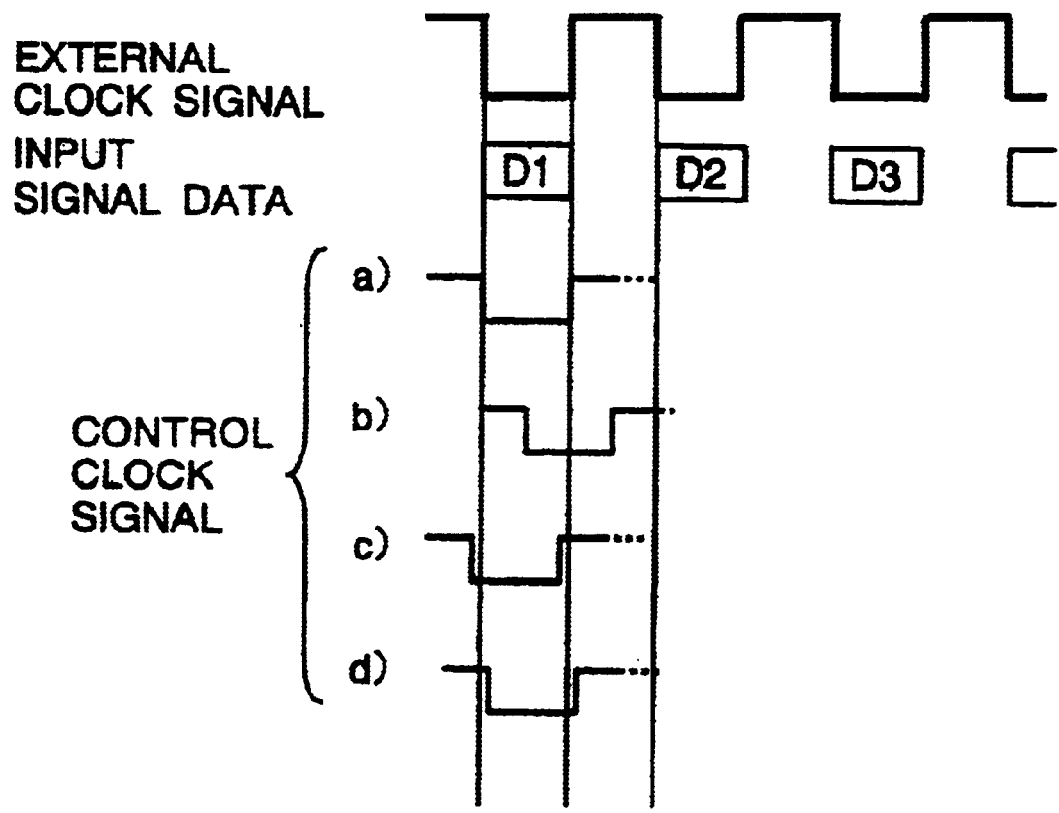
FIG. 4 is a diagram for explaining the operation of the embodiment shown in FIG. 3.

For example, as shown in FIG. 4, the use of the control clock signal in a testing function mode is enabled in the case where the phase deviation of the control clock signal from the external clock signal is nearly zero as shown by a) of FIG. 4, in the case where it is −5% as shown by c) and in the case where it is +1% as shown by d). On the other hand, in the case where the phase deviation is +50% as shown by b), the use of the control clock signal in a testing function mode is disabled. The permissible limit for the control clock signal may be set properly in accordance with the design specification of the input interface circuit. For example, whether or not integration voltages obtained using the control clock signal in regard to the first and second transistors P53 and P54 in the input circuit section 1 of the input interface circuit having a certain driving capability are sufficiently large, may be taken judgement criterion for permissible limit.

What is claimed is:

1. A method of testing an integrated circuit device, the method comprising:

applying a reference signal having a first voltage value to an input circuit of the integrated circuit device;

applying an input signal having a second voltage value to the input circuits
wherein the input signal is a digital signal;
applying a sequentially varying control voltage to the input circuit; and
determining a drive capability of either of two transistors within the input circuit which receive the reference signal and the input signal, respectively, based upon a value of the control voltage at a selected time.

2. The method of claim 1, wherein one of the reference signal and the input signal is a sequentially varying signal and the sequentially varying control voltage is held constant,
wherein said step of determining is performed based on the sequentially varying signal.

3. The method of claim 1, further comprising supplying a clock control signal to the input circuit.

4. The method of claim 3, wherein the control clock signal is substantially in phase with an external clock.

5. The method of claim 3, wherein a phase variation of the clock control signal with respect to an external clock is determined by the drive capability of said either of two transistors.

6. The method of claim 3, wherein the clock control signal has a maximum phase variation from an external clock which is a function of the drive capability of said either of two transistors.

7. The method of claim 1, wherein the second voltage value is within a predetermined range of the first voltage value.

8. A method of testing an integrated circuit device, comprising:
applying a reference signal having a first voltage value to an input circuit of the integrated circuit device;
applying an input signal having a second voltage value to the input circuit,
wherein the second voltage value is within a predetermined range of the first voltage value;
applying a sequentially varying control voltage to the input circuit; and
determining a drive capability of a transistor within the input circuit which receives one of the reference signal and the input signal based on a value of the control voltage at a selected time.

9. The method of claim 8, wherein one of the reference signal and the input signal is a sequentially varying signal and the control voltage is constant, and said step of determining is performed based on the sequentially varying signal.

10. The method of claim 8, further comprising supplying a clock control signal to the input circuit.

11. The method of claim 10, wherein the control clock signal is essentially in phase with an external clock.

12. The method of claim 10, wherein the clock control signal has a maximum phase variation from the external clock which is a function of the drive capability of the transistor.

13. The method of claim 10, wherein a phase variation of the clock control signal with respect to an external clock is determined by the drive capability of the transistor.

14. The method of claim 8, wherein the input signal is a digital signal.

15. An input circuit for an integrated circuit, comprising:
input signal processing means for receiving an input signal, generating a reference value, and integrating the input signal;
a comparing circuit which receives the reference value and the integrated input signal and outputs a logic value related to the input signal; and
a test circuit which applies a sequentially varying voltage to the input signal processing means and determines a value of the sequentially varying voltage when the logic value changes from one state to another;
a clock input terminal to which an external clock signal is applied; and
a clock signal generating circuit connected to the clock input terminal,
said clock signal generating circuit providing a control signal derived from the external clock signal,
wherein the input signal processing means receives the control signal and integrates the input signal based upon the control signal.

16. The input circuit of claim 15, wherein the control signal is essentially in phase with the external clock.

17. The input circuit of claim 15, wherein the control signal supplies power to the test circuit.

18. The input circuit of claim 15, wherein a maximum phase difference between the external clock and the control signal is based upon the integrated input signal.

19. The input circuit of claim 15, wherein a phase difference of the clock control signal with respect to an external clock is determined by the integrated input signal.

20. The input circuit of claim 15, wherein the input signal is a digital signal.

21. An input interface circuit comprising:
a clock input terminal receiving an external clock signal;
a control signal generating circuit connected to the clock input terminal and generating a control signal based on the external clock signal; and
integrating means for receiving an input signal and the control signal and integrating the input signal for a time period controlled by the control signal,
wherein a phase deviation between the external clock signal and the control signal is determined by the integrated input signal,
wherein the input signal is a digital signal.

* * * * *